(12) United States Patent
Barbier et al.

(10) Patent No.: US 6,388,465 B1
(45) Date of Patent: *May 14, 2002

(54) RECONFIGURABLE INTEGRATED CIRCUIT WITH INTEGRATED DEBUSSING FACILITIES AND SCALABLE PROGRAMMABLE INTERCONNECT

(76) Inventors: Jean Barbier, 43 rue Gay-lussac, 92320 Chatillon; Olivier LePape, 2 rue Antoine Roucher, 75016 Paris; Frederic Reblewski, 10 rue de Roussigny, 91470 Les Molieres, all of (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/525,210

(22) Filed: Mar. 14, 2000

Related U.S. Application Data

(63) Continuation of application No. 08/985,372, filed on Dec. 4, 1997, now Pat. No. 6,057,706, which is a continuation of application No. 08/542,838, filed on Oct. 13, 1995, now Pat. No. 5,777,489.

(51) Int. Cl.$^7$ ............................................. H03K 19/177
(52) U.S. Cl. ............................. 326/40; 326/39; 326/41; 326/16; 714/727
(58) Field of Search .............................. 326/39, 40, 16, 326/46, 93, 41; 714/3, 733, 727

(56) References Cited

U.S. PATENT DOCUMENTS

| | | | | |
|---|---|---|---|---|
| 4,669,061 A | * | 5/1987 | Bhavsar | 365/154 |
| 4,722,084 A | * | 1/1988 | Morton | 714/3 |
| 7,876,466 | * | 10/1989 | Kondou et al. | 326/38 |
| 4,942,577 A | * | 7/1990 | Ozaki | 714/731 |
| 4,974,226 A | * | 11/1990 | Fujimori et al. | 714/726 |
| 5,084,874 A | * | 1/1992 | Whetsel, Jr. | 714/727 |
| 5,530,706 A | * | 6/1996 | Josephson et al. | 714/727 |
| 5,553,082 A | * | 9/1996 | Connor et al. | 714/733 |
| 5,574,388 A | * | 11/1996 | Barbier et al. | 326/41 |
| 5,777,489 A | * | 7/1998 | Barbier et al. | 326/40 |
| 6,057,706 A | * | 5/2000 | Barbier et al. | 326/39 |

* cited by examiner

*Primary Examiner*—Michael Tokar
*Assistant Examiner*—Steven S. Paik
(74) *Attorney, Agent, or Firm*—Columbia IP Law Group, PC

(57) ABSTRACT

A number of enhanced logic elements (LEs) are provided to form a [FPGA] reconfigurable integrated circuit (IC). Each enhanced LE comprises a multiple input-single output truth table, and a complementary pair of master-slave latches having a data, a set and a reset input. Each enhanced LE further comprises a plurality of multiplexers and buffers, and control logic. Additionally, the improved [FPGA] IC may further comprise[s] a scalable network of crossbars, a context bus, a scan register, and/or a plurality of trigger circuitry. As a result, each LE may be individually initialized, its signal state frozen momentarily, the frozen state be read, trace data be output, and trigger inputs be conditionally generated, making the IC particularly suitable for circuit design emulation. Furthermore, the enhanced LEs may be used for "level sensitive" as well as "edge sensitive" circuit design emulations.

28 Claims, 11 Drawing Sheets

RECONFIGURABLE INTEGRATED CIRCUIT WITH INTEGRATED DEBUSSING FACILITIES AND SCALABLE PROGRAMMABLE INTERCONNECT

RELATED APPLICATION

This application is a continuation of application Ser. No. 08/985,372 entitled "Field Programmable Gate Array With Integrated Debugging Facilities" filed on Dec. 4, 1997 now issued as U.S. Pat. No. 6,057,706 which is a continuation of application Ser. No. 08/542,838 filed on Oct. 13, 1995 now issued as U.S. Pat. No. 5,777,489 entitled "Field programmable Gate Array with Integrated Debugging Facilities."

BACKGROUND OF THE INVENTION

1. Field of the Invention

The present invention relates to the fields of field programmable gate array (FPGA) and emulation systems.

2. Background Information

Emulation systems for emulating circuit design are known in the art. Typically, prior art emulation systems are formed using general purpose FPGAs without integrated debugging facilities. A circuit design to be emulated is "realized" on the emulation system by compiling a "formal" description of the circuit design, and mapping the circuit design onto the logic elements (LEs) of the FPGAs.

These general purpose FPGAs, as far as their applications to emulation systems are concerned, have a number of disadvantages. First of all, the states of signals at the nodes mapped inside the FPGAs are not directly observable, thus the term "hidden" nodes. Secondly, in order to be able to observe the states of signals at these "hidden" nodes, reconfiguration, and therefore extremely time consuming recompilation is required to bring these signals outside the FPGAs to a logic analyzer. Thirdly, a number of the FPGA I/Os will have to be consumed for bringing these signals to the logic analyzer. Furthermore, the additional signals to be routed further increase signal routing congestion. Finally, for timing sensitive applications, it is difficult to know whether the signals at these "hidden" nodes were read at precisely the correct time or not, if the signals are to be read in response to the occurrence of certain events, since the signals have to be brought out of the FPGAs before the read triggering events can be detected.

Thus, it is desirable to have an improved FPGA with integrated debugging facilities that is more suitable for usage by the emulation systems. As will be described in more detail below, the present invention provides for such an improved FPGA with integrated debugging facilities that achieves these and other desired results, which will be apparent to those skilled in the art from the description to follow.

SUMMARY OF THE INVENTION

An improved FPGA having integrated debugging facilities is disclosed. The improved FPGA comprises a number of enhanced logic elements (LEs) interconnected to each other, preferably, via a network of crossbars. Each enhanced LE comprises a multiple input-single output truth table and a complementary pair of master-slave latches having a data, a set and a reset input, and control logic. As a result, the enhanced LE may be used for "level sensitive" as well as "edge sensitive" circuit design emulations. Each enhanced LE further comprises a plurality of multiplexors and buffers, allowing each LE to be individually initialized, its state to be froze momentarily, and the frozen state to be read or modified.

Additionally, the improved FPGA is further comprises a complementary context bus and read/write facilities for setting the enhanced LEs' initial values, and for reading of their frozen states. The improved FPGA also comprises a scan register for outputting trace data for the enhanced LEs. Lastly, the improved FPGA also comprises a plurality of trigger circuitry for conditionally generating a plurality of trigger inputs.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Figure 1:
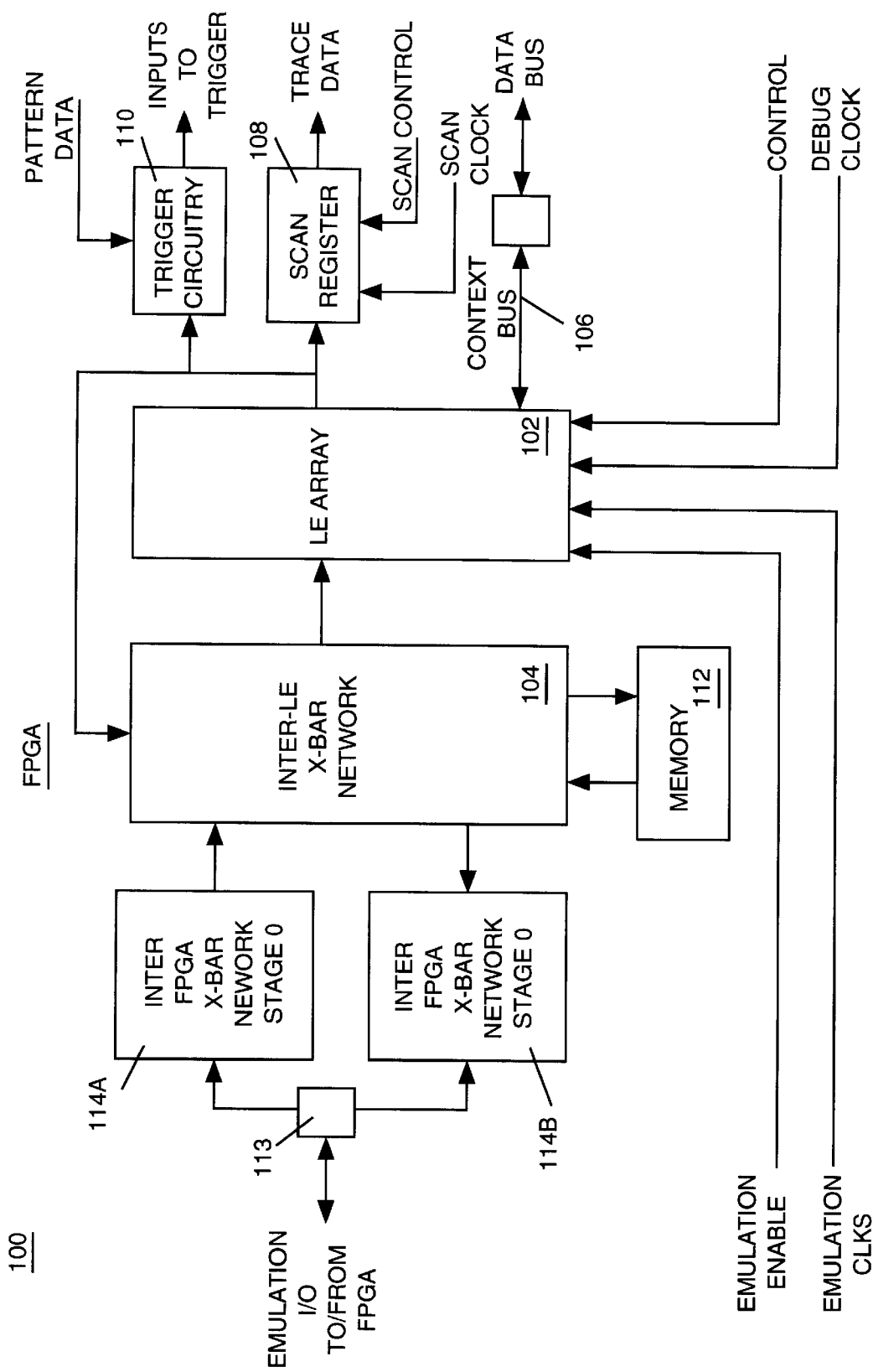
FIG. 1 illustrates the major functional blocks of the FPGA of the present invention.

Referring now to FIG. 1, the major functional blocks of improved FPGA 100 of the present invention is illustrated. As shown, FPGA 100, which is disposed on a single integrated circuit (or chip), comprises an array 102 of enhanced LEs incorporated with the teachings of the present invention. As in the prior art, the enhanced LEs are used to "realize" various elements of circuit designs, however, as will be disclosed in more detail below, unlike the prior art, the enhanced LEs include new and innovative debugging features.

Additionally, FPGA 100 further advantageously includes on-chip context bus 106, scan register 108 and trigger circuitry 110, coupled to the enhanced LEs as shown. As will be disclosed in more detail below, context bus 106 is used for inputting and outputting values to and from the LEs, whereas scan register 108 and trigger circuitry 110 are used to output trace data and trigger inputs for FPGA 100 respectively.

Preferably, FPGA 100 includes memory 112 to facilitate usage of FPGA 100 for emulating circuit designs with memory. In one embodiment, memory 112 is 16-bit wide. Preferably, the pins 113 of FPGA 100 can be used for either input or output. In one embodiment, 64 I/O pins 113 are provided to FPGA 100. Preferably, FPGA 100 also includes inter-LE crossbar (or x-bar) network 104 for interconnecting the LEs, memory 112, and I/O pins 113, as shown. Finally, it is also preferable for FPGA 100 to include "two copies" of the first stage of a crossbar network 114a–114b for inter-connecting FPGA 100 to other FPGAs and a "host system".

Memory 112 is well known in the art and will not be further described. Inter-LE crossbar network 104 and the first stage of inter-FPGA crossbar network 114a–114b are described in detail in application Ser. No. 08/542,519, now issued as U.S. Pat. No. 5,574,388, entitled "Emulation system having a scalable multi-level multi-stage programmable interconnect network", having common inventorship and assignee interest as the present invention, and filed contemporaneously with the present application, which is hereby fully incorporated by reference. Nevertheless, network 104 and network stage0 114a–114b will be briefly described below. LEs, context bus 106, scan register 108, and trigger circuitry 110 will be described in further detail below with additional references to the remaining figures.

Before describing these elements in further detail, it should be noted that while for ease of explanation, the present invention is being described in the context of emulation, however, based on the description to follow, a person skilled in the art will appreciate that the present invention may be adapted for other applications beside emulation systems.

Figure 2:
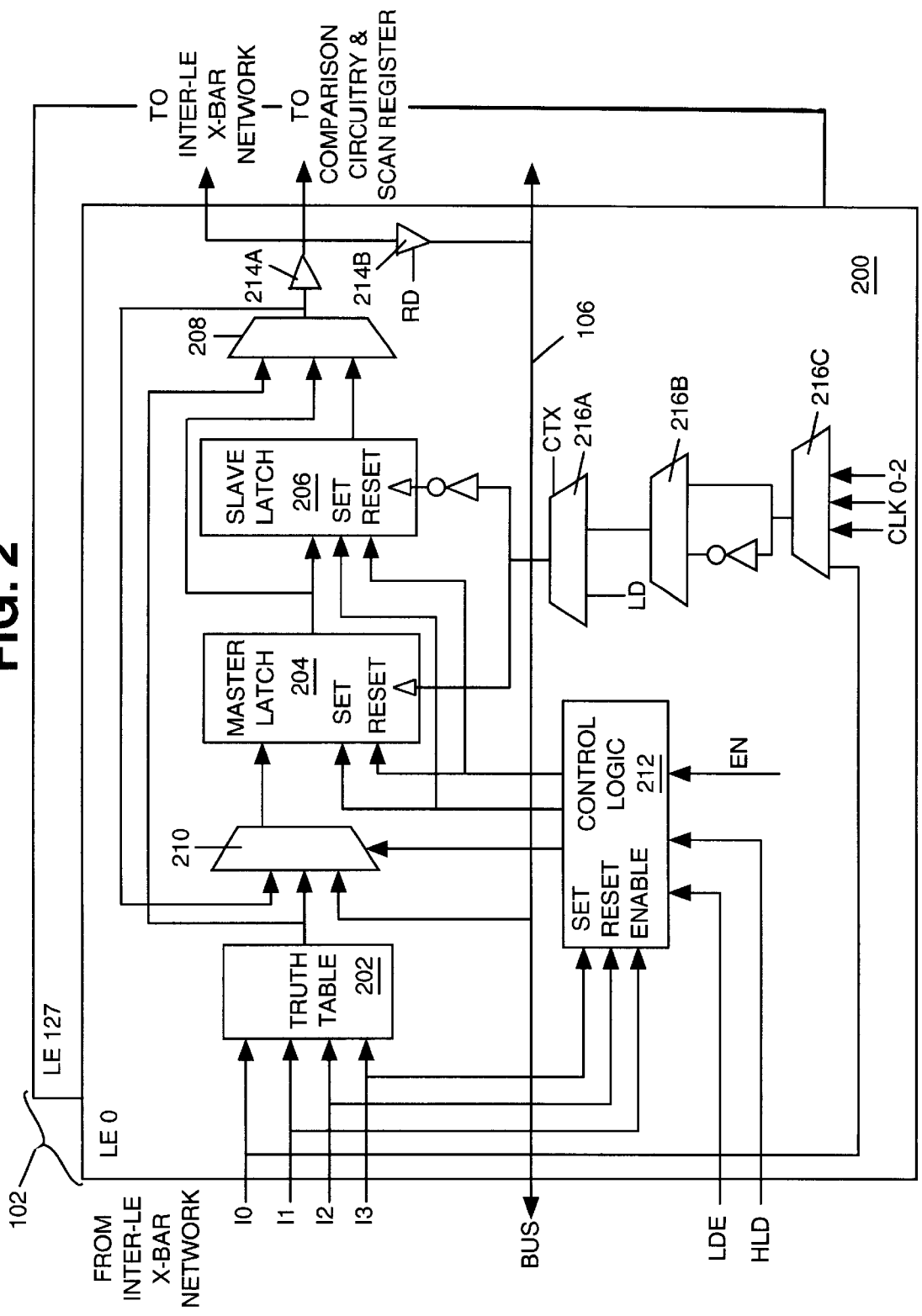
FIG. 2 illustrates one embodiment of the LE array of FIG. 1, and one embodiment of the enhanced LE.

FIG. 2 illustrates one embodiment of the array of enhanced LEs of FIG. 1 and one embodiment of the LEs themselves in further detail. As shown, LE array 102 comprises a plurality of enhanced LEs 200 of the present invention. In one embodiment, LE array 102 comprises 128 LEs 200. Each LE 200 includes a multiple input—single output truth table 202, a pair of master-slave latches 204–206, output multiplexor 208, input multiplexor 210, and control logic 212, coupled to each other as shown.

Truth table 202 is used to generate a predetermined output in response to a set of inputs. For the illustrated embodiment, truth-table 202 has 4 inputs and 1 output. In other words, depending on the inputs, truth table 202 outputs 1 of $2^4$ of predetermined outputs. Each of master-slave latches 204–206 is used to store an input value synchronously with its clock input. Furthermore, each of master-slave latches 204–206 can be asynchronously forced to one or zero depending on the values of set and reset. For the illustrated embodiment, the set and reset inputs are provided using the inputs 13 and 12 of truth table 202. In other words, if set/reset is used, the number of input variations that can be provided to truth-table 202 are reduced. Alternatively, additional dedicated pins may be provided to provide the set/reset signals to master-slave latches 204–206, however the real estate requirement of the FPGA will be increased.

Output multiplexor 208, input multiplexor 210 and control logic 212 are used to control the manner in which truth table 202 and master-slave latches 204–206 are used. Output multiplexor 208 allows either the output of truth table 202 (by-passing master-slave latches 204–206) or the output of slave latch 206 (for level sensitive designs), or the output of master latch 204 (for edge sensitive designs) to be selected for output. The by-passed output is selected if truth table 202 is to be used standalone. When either the output of master or slave latch 204 or 206 is selected, input multiplexor 210 allows either the output of truth table 202, the feedback from output multiplexor 208, or an input value on context bus 106 to be provided to master-slave latches 204–206. The feedback value is selected to "freeze" LE 200, and the bus value is selected to initialize LE 200. Control logic 212 controls input multiplexor 210 and the set and reset values provided to master-slave latches 204–206, in accordance to a set, a reset, a first and a second enable (ENAB and EN), a load (LDE) and a hold (HLD) value provided, to be described more fully below.

Each LE 200 also includes clock selection multiplexors 216a–216c for selectively providing a number of emulation clocks or a debug clock (LD) to master-slave latches 204–206. Preferably, the emulation clocks include a "constructed" emulation clock using other LEs 200. For the illustrated embodiment, this "constructed" emulation clock is made available through I0 of truth table 202. One of the emulation clocks is provided to master-slave latches 204–206 during normal operation, whereas the debug block (LD) is provided during debugging. The clock selection is controlled by the CTX signal. Lastly, LE 200 also includes buffer 214a for outputting the selected output to inter-LE X-bar network 104 and the on-chip debugging facilities, and buffer 214b for outputting the selected output onto context bus 106 for direct observation outside FPGA 100.

In sum, truth table 202 may be used in a standalone manner, or in conjunction with the corresponding master-slave latches 204–206. Enhanced LE 200 is suitable for "level sensitive" as well as "edge sensitive" circuit design emulations. Additionally, beside the "normal" current output of truth table 202, each LE 200 can be individually initialized. Each LE 200 can also be caused to output the same output over and over again, as if it is frozen. Furthermore, LEs 200 are individually and directly observable outside FPGA 100. In other words, there are no "hidden nodes". The state of each "node" is directly observable outside the FPGA, without requiring the reconfiguration and time consuming re-compilation of circuit design mappings normally performed under the prior art.

Figure 3:
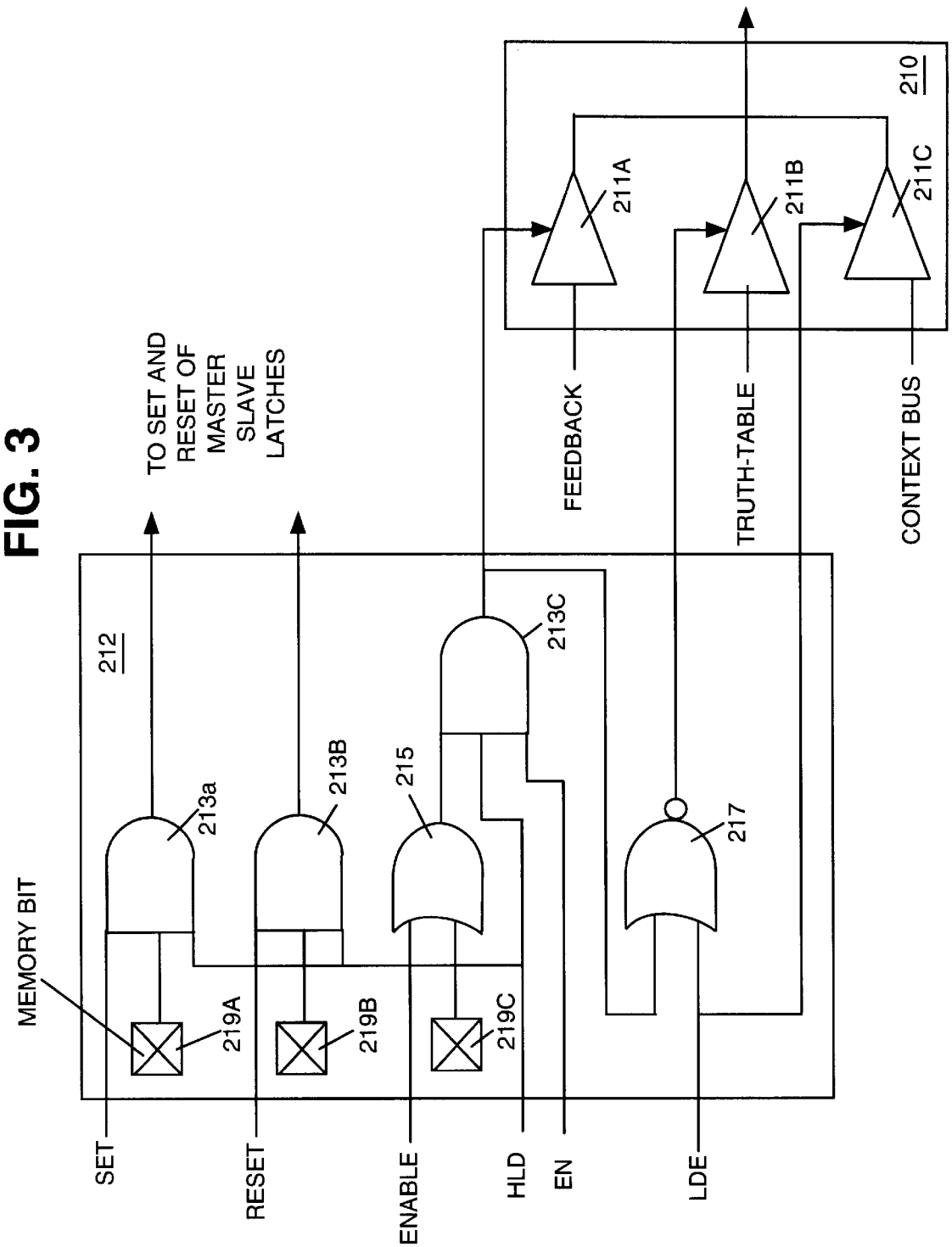
FIG. 3 illustrates one embodiment each of the control logic and input selector for the master-slave latches of FIG. 1.

FIG. 3 illustrates one embodiment each of input multiplexor 210 and control logic 212 in further detail. As shown, multiplexor 210 comprises drivers 211a–211c for outputting the feedback output, the output of truth-table 202, and the input value on context bus 106 respectively, if enabled. One of drivers 211a–211c is selectively enabled by control signals from control logic 212. Control logic 212 comprises AND gates 213a–213c, OR gate 215, NOR gate 217, and memory bits 219a–219c for generating the control signals for driver 211a–211c, as well as the set and reset values for master-slave latches 204–206. Memory bits 219a–219c are used to store configuration information for enabling the provision of the set and reset values and the selection of the feedback output. If enabled, AND gates 213a–213b provides the set and reset values in accordance to the set and HLD inputs, and the reset and HLD inputs respectively. If enabled, OR gate 215 in conjunction with AND gate 213c provide the control signal for driver 211a in accordance to the ENAB, HLD and EN inputs. NOR gate 217 provide the control signal for driver 211b in accordance to the control signal being provided for driver 211a and a LDE input. Lastly, the LDE input is provided as the control signal for driver 211c.

Figure 4A:
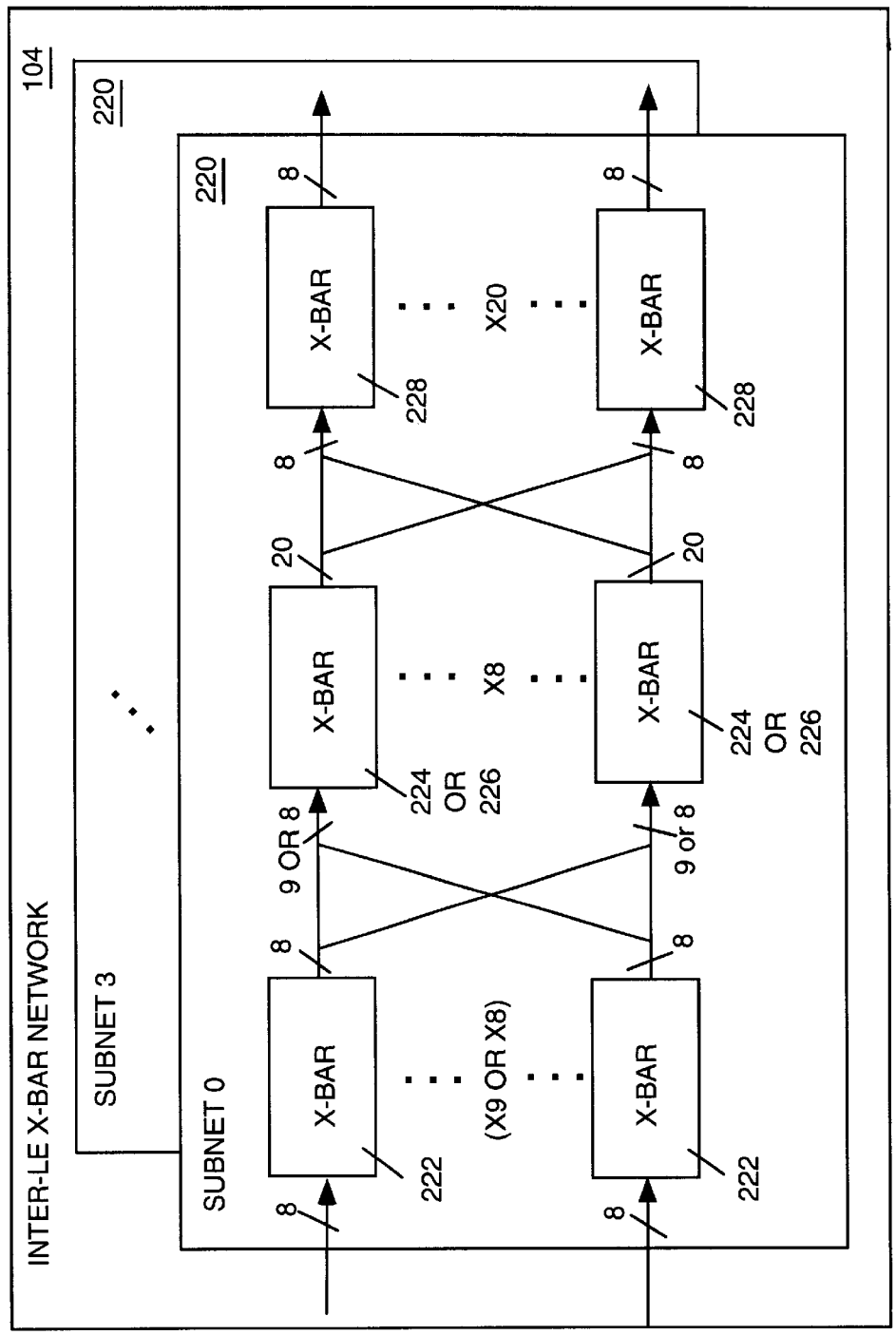
FIGS. 4a–4b illustrate one embodiment of the inter-LE crossbar network of FIG. 1
Figure 4B:
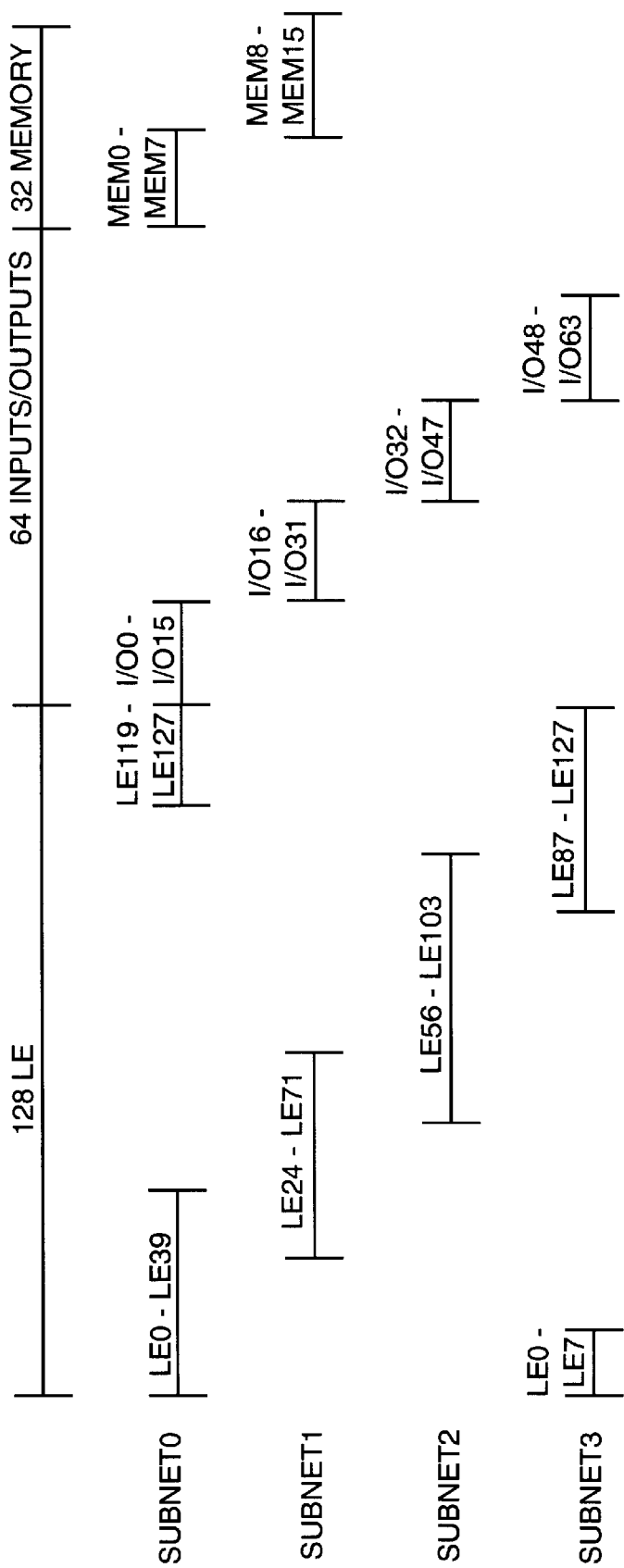

Referring now briefly to FIGS. 4a–4b, wherein one embodiment of inter-LE crossbar network 104 for interconnecting the LEs, the memory and the I/O pins is illustrated. As shown in FIG. 4a, for the illustrated embodiment, inter-LE crossbar network 104 comprises 4 subnetworks 220. The first two subnetworks, subnet0 and subnet1, are used to route 72 signals, whereas the remaining two subnetworks, subnet2 and subnet3, are used to rout 64 signals. More specifically, as shown in FIG. 4b, Subnet0 is used to route the signals of LE0–LE39, LE119–LE127, I/O0–I/O15 and M0–M7. Subnet1 is used to route the signals of LE24–LE71, I/O16–I/O31 and M8–M15. Subnet2 is used to route the signals of LE56–LE103, and I/O32–I/O47. Subnet3 is used to route the signals of LE0–LE7, LE88–LE127, and I/O48–I/O63. The overlapping coverage of the LEs provides increased flexibility of signal routing for mapping circuit designs.

Each subnetwork 220 is a three-stage Claus network comprising either 9 or 8 8-to-8 crossbars 222 in the first stage, 8 9-to-20 or 8-to-20 crossbars 224 or 226 in stage two, and 20 8-to-8 crossbars 228 in stage three. The stages are coupled to each other in the well known "butterfly" manner.

For further description of inter-LE crossbar network 104, refer to the incorporated by reference copending application Ser. No. 08/542,519 identified above.

Figure 5:
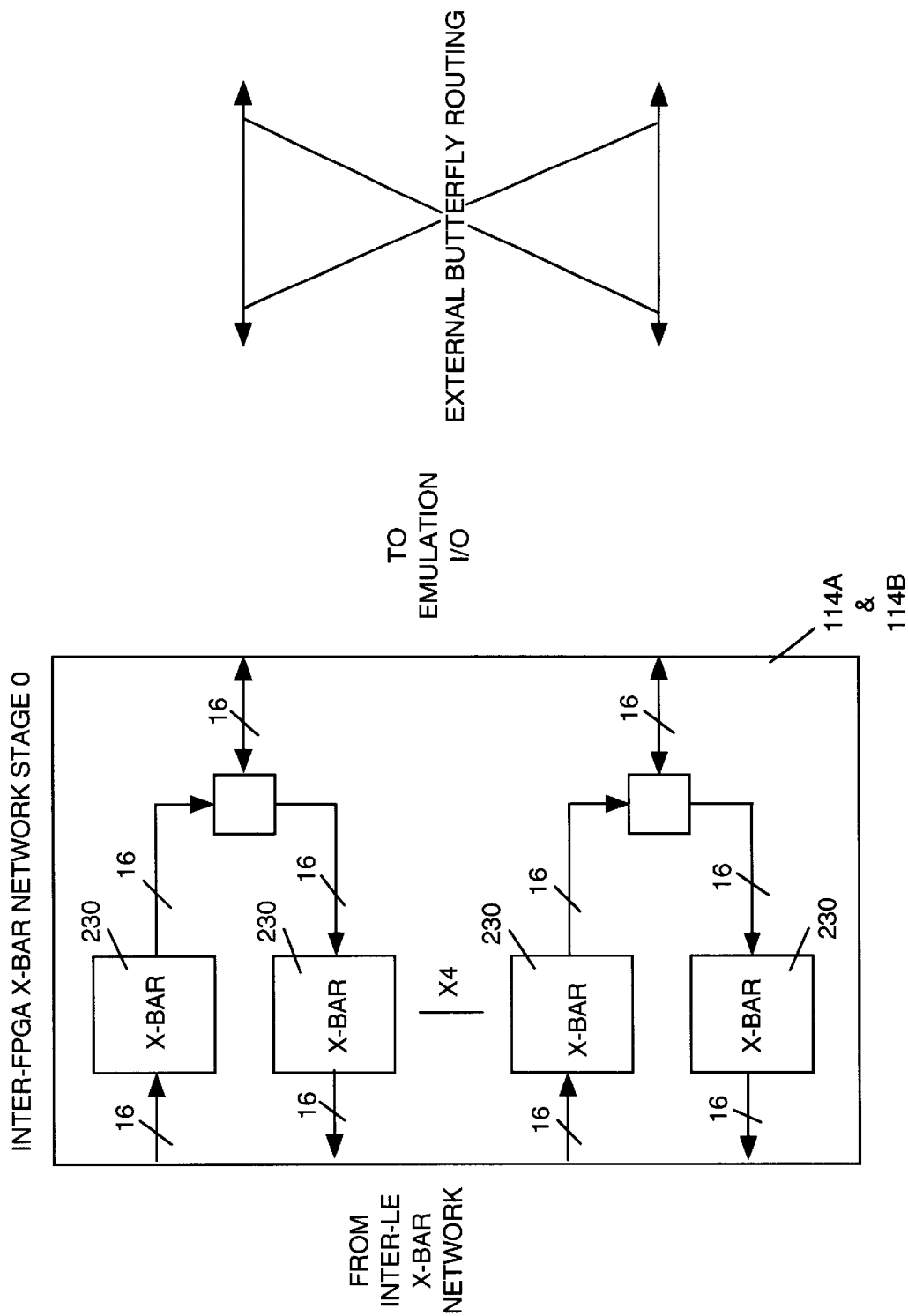
FIG. 5 illustrates one embodiment of the inter-FPGA crossbar network stage0 of FIG. 1.

Referring now also briefly to FIG. 5, wherein one embodiment of inter-FPGA crossbar network stage0 114a–114b for interconnecting the FPGA to other FPGAs and a "host" computer is illustrated. As shown, for the illustrated embodiment, inter-FPGA crossbar network stage0 114a–114b comprises 4 pairs of 16-to-16 crossbars 230 for coupling 64 I/O signals of the FPGA to the next stage of a Claus network for interconnecting the FPGA to other FPGAs and a "host" computer. For further description of inter-FPGA crossbar network 114a–114b, also refer to the incorporated by reference copending application Ser. No. 08/542,519 identified above.

Figure 6:
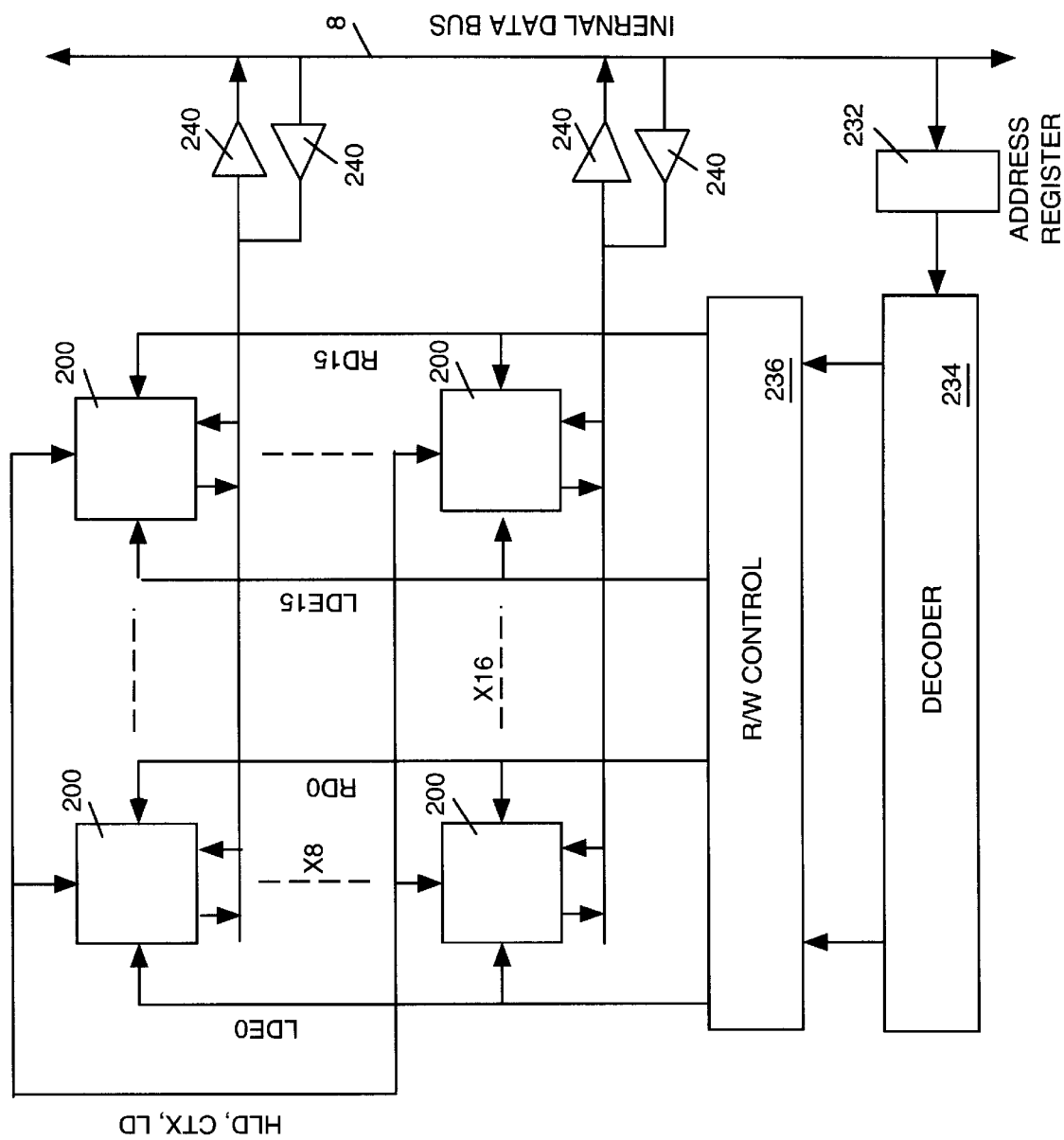
FIG. 6 illustrates one embodiment of the associated read/write facilities of the context bus of FIG. 1.

FIG. 6 illustrates one embodiment of the read/write facilities associated with context bus 106 for reading from and writing into LEs 200 of FPGA 100. As shown, for the illustrated embodiment, 128 LEs 200 are organized in 16 columns, with each column having 8 LEs 200. Thus, all 128 LEs 200, or the current context, can be read or written with 16 8-bit words. Address register 232 is provided for storing the read or write address. Decoder 234 is provided for decoding the read or write address, which in conjunction with R/W control 236 provide the appropriate read control signals (RD0–RD15) and write control signals (LDE0–LDE15) for the 128 LEs 200. Additionally, each LE 200 receives the earlier described HLD signal for "freezing" the LEs 200, the CTX signal for selecting the debug (LD) clock, and the LD clock itself.

Figure 7A:
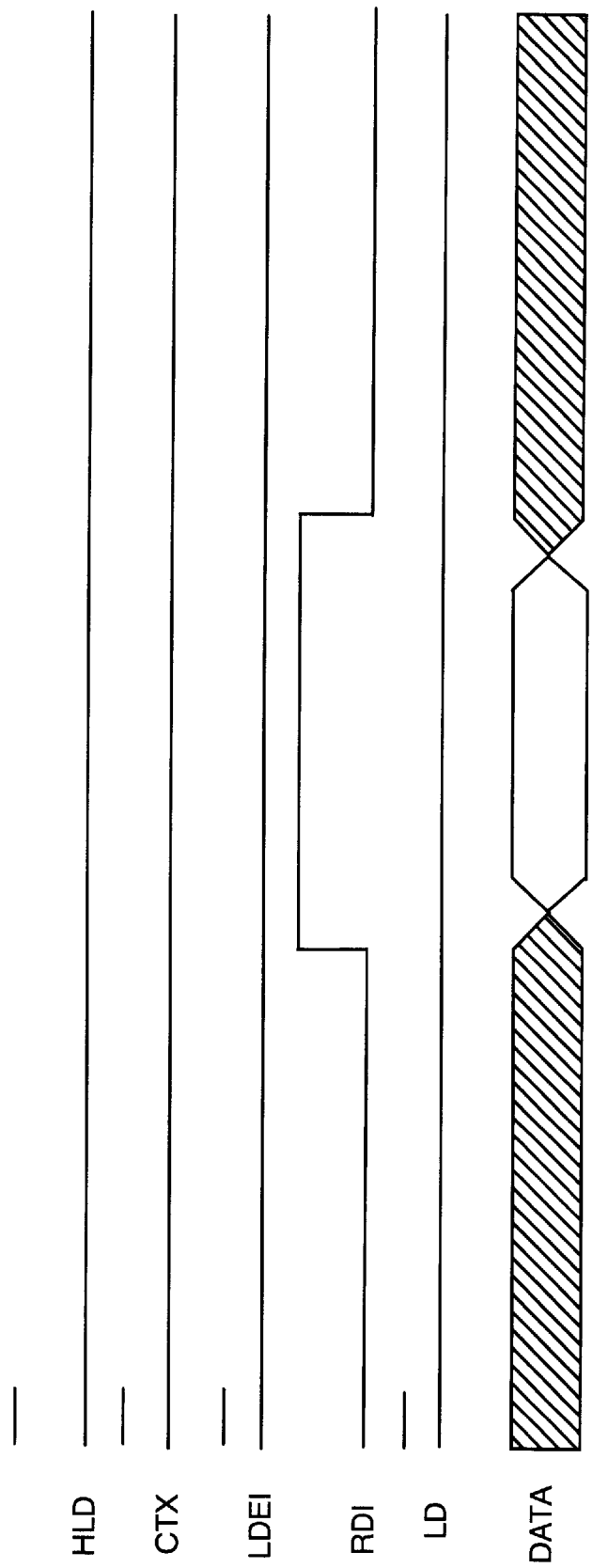
FIGS. 7a–7b are two exemplary timing diagrams illustrating the reading of a value from a LE and the writing of a value into a LE.
Figure 7B:
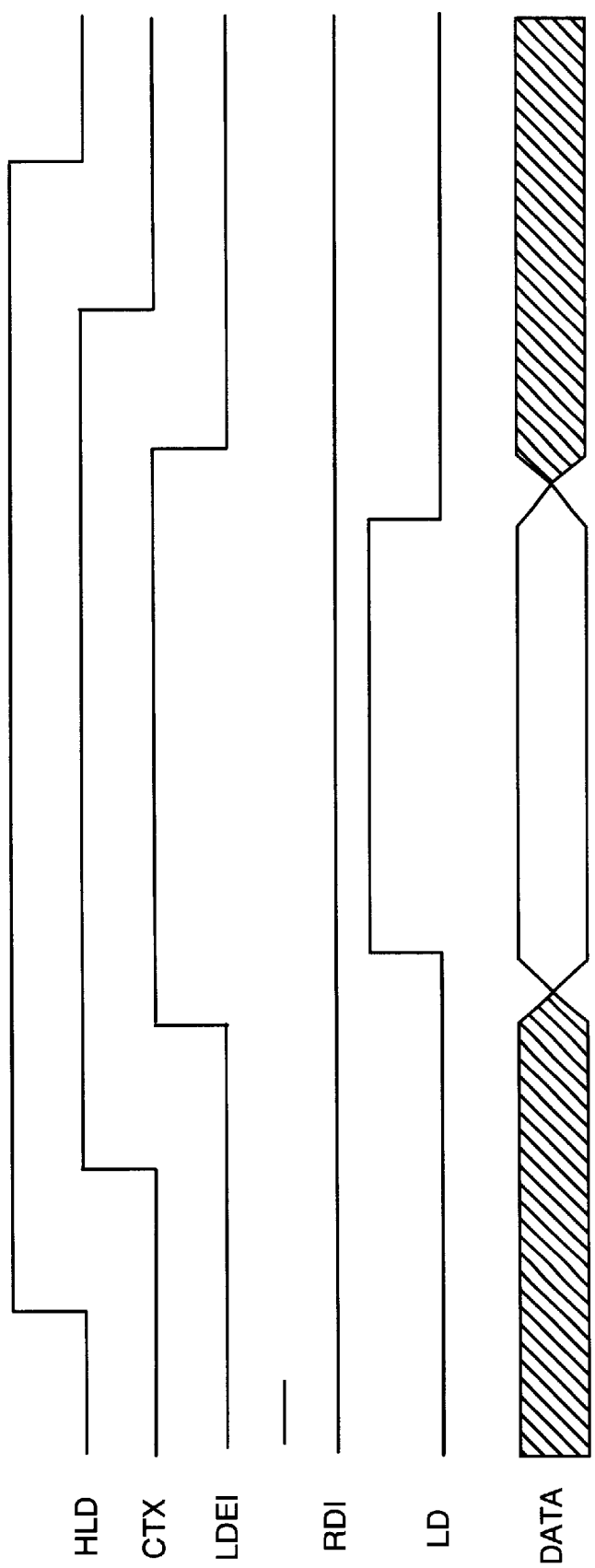

FIGS. 7a–7b illustrate exemplary signal timings for reading and writing. As shown in FIG. 7a, context reading is done by first loading a 4-bit address into address register 232. As a result, decoder 234 causes R/W control 236 to drive the appropriate RD signals high to read out the contents of the addressed LEs 200. (HLD, CTX, LDEi and LD all remain low while a read operation is in progress.) As shown in FIG. 7b, context writing is done by first loading a 4-bit address into address register 232. Additionally, before decoder 234 responds and causes R/W control 236 to drive the appropriate LDE signals high, HLD is first driven high to freeze all LEs 200. Furthermore, CTX is driven high to select debug clock LD for each LE 200. Then, when R/W control 236 drives the appropriate LDE signals, values on context bus 106 are loaded into the addressed LEs 200. It is important to freeze all LEs 200 during a context writing, because partial context could induce temporary states, which could in turn put an emulation system into an unknown state. For example, the final context may drive a given RESET signal to the low state, but the partial context (during the writing operation) may induce a temporary high state on the RESET signal, thus unpredictably resetting all the latches connected to the signal.

Figure 8:
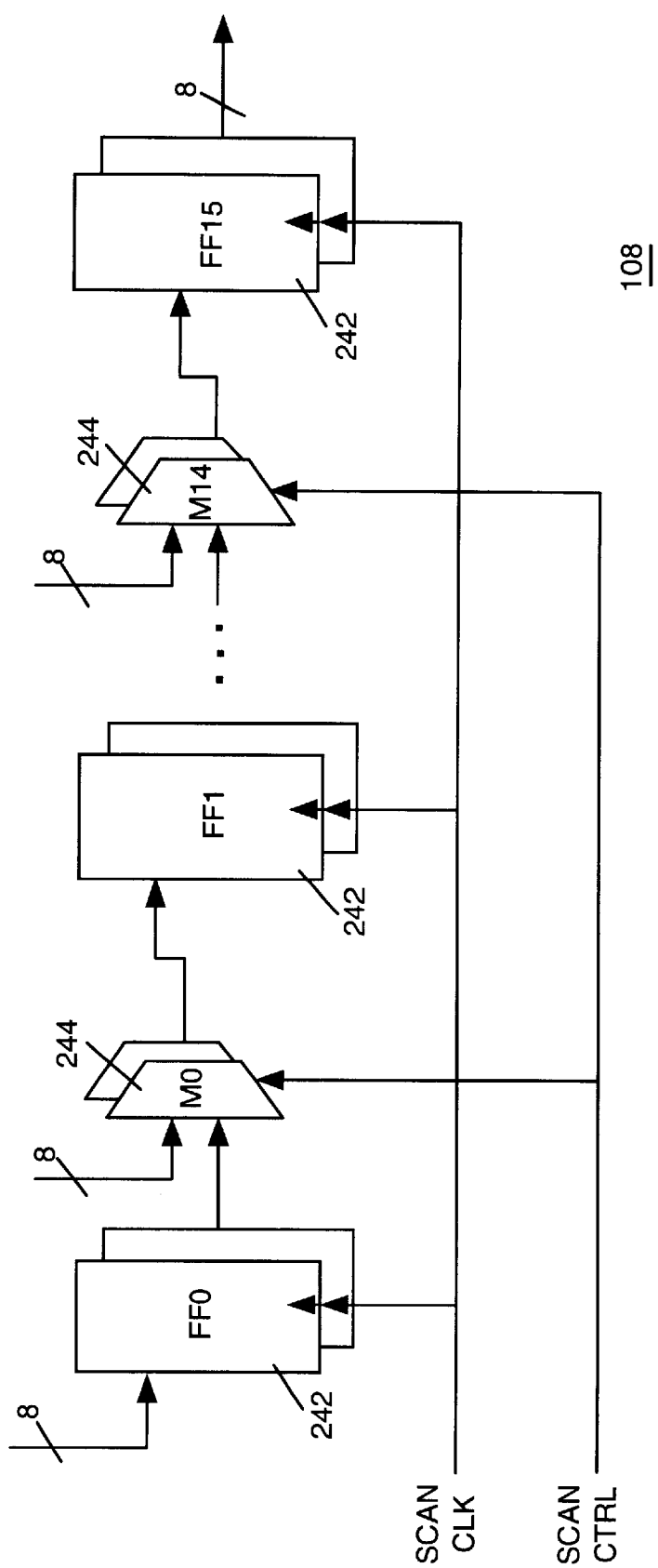
FIG. 8 illustrates one embodiment of the scan register of FIG. 1.

FIG. 8 illustrates one embodiment of scan register 108 for outputting trace data. As shown, for the illustrated embodiment, scan register 108 comprises 16 sets of 8 flip-flops 242, and 15 sets of 8 multiplexors 244, disposed in between flip-flop sets 242. Flip-flop set0 242 is coupled to a first group of 8 LEs 200. Multiplexor set0 244 is coupled to flip-flop set0 242 and a second group of LEs 200. Flip-flop set1 242 is coupled to multiplexor set0, and so forth. Flip-flop set0 242 sequentially receives and propagates the outputs of the first group of 8 LEs 200. Multiplexor set0 242 either serially provides the outputs of flip-flop set0 242 or the outputs of the second group of 8 LEs. Flip-flop set1 242 in turn sequentially propagates the inputs it received from multiplexor set0 244. Flip-flop sets 242 are controlled by a scan clock, whereas, multiplexor sets 244 are controlled by a scan control signal. Thus, by applying a scan clock having the appropriate divided frequency (relative to the operating emulation clock), and selectively applying the appropriate scan control signal to the multiplexor sets 244, a snapshot of 128 LEs at a particular clock cycle can be sequentially scanned out of FPGA 100.

Figure 9:
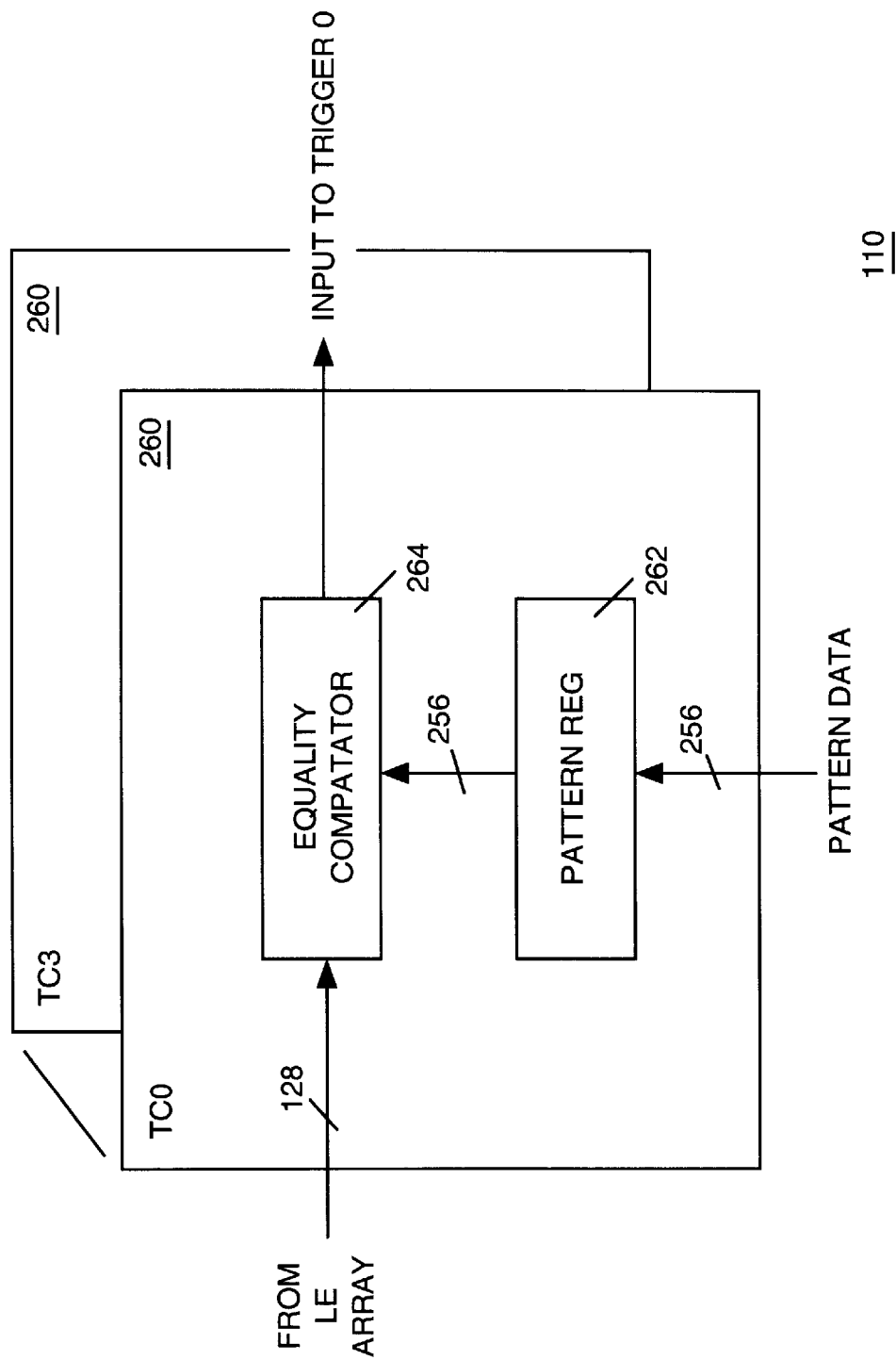
FIG. 9 illustrates one embodiment of the trigger circuitry of FIG. 1.

FIG. 9 illustrates one embodiment of trigger circuitry 110 for outputting trigger inputs. As shown, for the illustrated embodiment, trigger circuitry 110 comprises 4 comparator-register circuits 260 for generating 4 trigger inputs, one from each comparator-register circuit 260. Each comparator-register circuit 260 includes a register 262 for storing a signal pattern, and an equality comparator 264 for comparing the outputs of the LEs to the stored content of pattern register 262. In one embodiment, the signal pattern comprises 2-bits per LE 200, allowing the values of High, Low, or Don't Care to be encoded. An input to a trigger outside FPGA 100 is generated whenever the stored pattern is detected. In other words, for the illustrated embodiment, 4 LE internal state events can be monitored simultaneously.

Thus, an improved FPGA with integrated debugging facility that is particularly suitable for emulation systems has been described. While the method and integrated circuit of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. A single integrated circuit comprising
   a plurality of logic elements (LEs) for generating a plurality of output signals in response to a plurality of input signals correspondingly applied to the LEs, each of the LEs being equipped to hold constant the LE's output signal on demand; and
   a context bus, including associated read/write control facilities for reading from and writing into LEs, coupled to the LEs for outputting individual signal state values of the LEs out of the integrated circuit, and for initializing the LEs with individual signal state values provided to the integrated circuit while the output signals of the LEs are being held constant.

2. The integrated circuit as set forth in claim 1, wherein the integrated circuit further comprises a scan register coupled to the LEs for serially capturing and outputting a trace record of all signal state values of the LEs in a particular clock cycle of an operating clock outside the integrated circuit, the scan register being provided with a scan clock appropriately scaled to the operating clock.

3. The integrated circuit as set forth in claim 1, wherein the integrated circuit further comprises trigger circuitry coupled to the LEs for conditionally generating at least one trigger value depending on the signal state values of the LEs.

4. The integrated circuit as set forth in claim 3, wherein the trigger circuitry comprises
   a first register for storing a first trigger pattern; and
   a first comparator coupled to the LEs and the first register for conditionally generating a first trigger value if signal state values of the LEs match the stored first trigger pattern.

5. The integrated circuit as set forth in claim 1, wherein each LE further includes a multiple input-single output truth table for generating a first intermediate output signal in response to a first set of input signals;
   a first selector coupled to the truth table and the context bus for selecting either the first intermediate output signal, the output of the LE fedback to the first selector, or a predesignated bus signal on the context bus, and outputting the selected signal; and
   a first control circuit coupled to the first selector for controlling the first selector.

6. The integrated circuit as set forth in claims 5, wherein each LE further comprises
   a pair of master-slave latches, each having a data input, a set input, and a reset input, coupled to the first selector for generating a second and a third intermediate output signal in response to the data, set, and reset inputs, the selected and third intermediate output signals being provided as data inputs to the master and slave latches respectively;
   a second control circuit coupled to the pair of master-slave latches for providing each of the master and slave latches with a set and a reset value; and
   a second selector coupled to the truth table and the master-slave latches for selecting either the first, second or third intermediate output signal as the output signal of the LE.

7. The integrated circuit as set forth in claim 6, wherein each LE further comprises a buffer coupled to the second selector for outputting the output signal of the LE onto the context bus.

8. The integrated circuit as set forth in claim 6, wherein the second control circuit comprises a first and a second AND gate for receiving a first and a second plurality of input control signals, and in response, generating the set and reset values for the master and slave latches respectively.

9. The integrated circuit as set forth in claim 6, wherein the LE further comprises a third selector for selectively providing either an emulation clock or a debugging clock to the master and slave latches.

10. The integrated circuit as set forth in claim 9, wherein the LE further comprises a fourth and a fifth selector for selectively providing one of a plurality of clocks to the third selector as the emulation clock.

11. The integrated circuit as set forth in claim 5, wherein the first control circuit comprises an OR gate and an AND gate serially coupled to the OR gate for receiving a plurality of input control signals, and in response, generating an output control signal for causing the first selector to select the output signal of the LE fedback to the first selector.

12. The integrated circuit as set forth in claim 5, wherein the first control circuit comprises a NOR gate for receiving a plurality of input control signals, and in response generating an output control signal for causing the first selector to select the first intermediate output signal.

13. The integrated circuit as set forth in claim 5, wherein the control circuit receives a load control signal, and in response, output the load control signal for the first selector for causing the first selector to select the predesignated bus signal on the context bus.

14. A single integrated circuit comprising a plurality of logic elements (LEs) for generating a plurality of output signals in response to a plurality of input signals correspondingly applied to the LEs, and a scan register coupled to the LEs for serially capturing and outputting a trace record of all signal state values of the LEs in a particular clock cycle of an operating clock outside the integrated circuit the scan register being provided with a scan clock appropriately scaled to the operating clock, wherein the integrated circuit further comprises trigger circuitry coupled to the LEs for conditionally generating at least one trigger value depending on the signal state values of the LEs.

15. The integrated circuit as set forth in claim 14, wherein the trigger circuitry comprises
   a first register for storing a first trigger pattern; and
   a first comparator coupled to the LEs the first register for conditionally generating a first trigger value if signal state values of the LEs match the stored first trigger pattern.

16. A single integrated circuit comprising a plurality of logic elements (LEs) for generating a plurality of output signals in response to a plurality of input signals correspondingly applied to the LEs, and a scan register coupled to the LEs for serially capturing and outputting a trace record of all signal state values of the LEs in a particular clock cycle of an operating clock outside the integrated circuit, the scan register being provided with a scan clock appropriately scaled to the operating clock, wherein
   each LE further includes a multiple input-single output truth table for generating a first intermediate output signal in response to a first set of input signals;
   a first selector coupled to the truth table and the context bus for selecting either the first intermediate output signal, or the output of the LE fedback to the first selector, and outputting the selected signal; and
   a first control circuit coupled to the first selector for controlling the first selector.

17. The integrated circuit as set forth in claim 16, wherein each LE further comprises
   a pair of master-slave latches, each having a data input, a set input, and a reset input, coupled to the first selector for generating a second and a third intermediate output signal in response to the data, set, and reset inputs, the selected and third intermediate output signals being provided as data inputs to the master and slave latches respectively;
   a second control circuit coupled to the pair of master-slave latches for providing each of the master and slave latches with a set and a reset value; and
   a second selector coupled to the truth table and the master-slave latches for selecting either the first, second or third intermediate output signal as the output signal of the LE.

18. The integrated circuit as set forth in claim 17, wherein the LE further comprises a third selector for selectively providing either an emulation clock or a debugging clock to the master and slave latches.

19. A single integrated circuit comprising a plurality of logic elements (LEs) for generating a plurality of output signals in response to a plurality of input signals correspondingly applied to the LEs, and trigger circuitry coupled to the LEs for conditionally generating at least one trigger value depending on the signal state values of the LEs, wherein each LE further includes a multiple input-single output truth table for generating a first intermediate output signal in response to a first set of input signals;

a first selector coupled to the truth table and the context bus for selecting either the first intermediate output signal, or the output of the LE fedback to the first selector, and outputting the selected signal; and a first control circuit coupled to the first selector for controlling the first selector.

20. The integrated circuit as set forth in claims 19, wherein each LE further comprises a pair of master-slave latches, each having a data input, a set input, and a reset input, coupled to the first selector for generating a second and a third intermediate output signal in response to the data, set, and reset inputs, the selected and third intermediate output signals being provided as data inputs to the master and slave latches respectively;

a second control circuit coupled to the pair of master-slave latches for providing each of the master and slave latches with a set and a reset value; and a second selector coupled to the truth table and the master-slave latches for selecting either the first, second or third intermediate output signal as the output signal of the LE.

21. The integrated circuit as set forth in claim 20, wherein the LE further comprises a third selector for selectively providing either an emulation clock or a debugging clock to the master and slave latches.

22. An integrated circuit comprising:

a plurality of reconfigurable logic elements (LE);

a plurality of input/output (I/O) pin;

a first network of programmable interconnects having a first plurality of subsets of programmable interconnects correspondingly coupled to subsets of the reconfigurable LEs; and a second network of programmable interconnects coupled to the first network of programmable interconnects and the plurality of I/O pins.

23. The integrated circuit of claim 22, wherein the integrated circuit further comprises a context bus coupled to the LEs to provide an additional access path to the LEs that does not go through said first and second networks programmable interconnects.

24. The integrated circuit of claim 22, wherein the integrated circuit further comprises a scan register coupled to the LEs to allow contents of the LEs to be scanned out of the LEs without having to retrieve said contents going through said first and second networks of programmable interconnects.

25. The integrated circuit of claim 22, wherein the integrated circuit further comprises a trigger circuitry coupled to the LEs to allow contents of the LEs to be read out and compared without having to effectuate said read out and compare going through said first and second networks of programmable interconnects.

26. The integrated circuit of claim 22, wherein the integrated circuit further comprises on-chip memory coupled to said first network of programmable interconnects.

27. The integrated circuit of claim 22, wherein the first network of programmable interconnects further comprises a second plurality of subsets of programmable interconnects coupled to said first plurality of subsets of programmable interconnects and said second network of programmable interconnects.

28. The integrated circuit of claim 27, wherein the first network of programmable interconnects further comprises a third plurality of subsets of programmable interconnects coupling said second plurality of subsets of programmable interconnects to said second network of programmable interconnects.

\* \* \* \* \*

UNITED STATES PATENT AND TRADEMARK OFFICE
CERTIFICATE OF CORRECTION

PATENT NO.    : 6,388,465 B1                                              Page 1 of 1
DATED         : May 14, 2002
INVENTOR(S)   : Jean Barbier et al.

It is certified that error appears in the above-identified patent and that said Letters Patent is hereby corrected as shown below:

<u>Title page, Item [54] and Column 1, line 2,</u>
"DEBUSSING" should read -- DEBUGGING --.

Item [57], ABSTRACT, "[FPGA]", "[FPGA]", and "[s]" should be deleted.

<u>Column 1,</u>
Line 66, "froze" should read -- frozen --.

<u>Column 2,</u>
Line 1, "FPGA is further comprises" should read -- FPGA further comprises --.

<u>Column 3,</u>
Line 43, "truth-table 202" should read -- truth table 202 --.
Line 51, "13 and 12" should read -- I3 and I2 --.
Line 53, "truth-table 202" should read -- truth table 202 --.

<u>Column 4,</u>
Line 64, "pins is illustrated." should read -- pins are illustrated. --.

<u>Column 5,</u>
Line 3, "rout 64" should read -- route 64 --.

Signed and Sealed this

Fourteenth Day of January, 2003

JAMES E. ROGAN
*Director of the United States Patent and Trademark Office*